(12) United States Patent
Kim

(10) Patent No.: US 7,649,219 B2
(45) Date of Patent: Jan. 19, 2010

(54) IMAGE SENSOR AND METHOD OF MANUFACTURING THE SAME

(75) Inventor: Seong Gyun Kim, Eumsoeg-goon (KR)

(73) Assignee: Dongbu Hitek Co., Ltd., Seoul (KR)

( * ) Notice: Subject to any disclaimer, the term of this patent is extended or adjusted under 35 U.S.C. 154(b) by 115 days.

(21) Appl. No.: 11/842,580

(22) Filed: Aug. 21, 2007

(65) Prior Publication Data

US 2008/0258189 A1    Oct. 23, 2008

(30) Foreign Application Priority Data

Apr. 23, 2007  (KR) .................. 10-2007-0039099

(51) Int. Cl.
*H01L 31/062* (2006.01)
(52) U.S. Cl. .................. 257/292; 257/444; 257/446; 257/448; 257/459; 257/E27.133; 438/80; 438/81; 438/98
(58) Field of Classification Search ............. 257/292, 257/444, 446, 448, 459, E27.133; 438/80, 438/81, 98
See application file for complete search history.

(56) References Cited

U.S. PATENT DOCUMENTS 6,720,594 B2    4/2004  Rahn et al.

2003/0057357 A1*  3/2003  Uppal et al. ............. 250/208.1
2003/0111704 A1*  6/2003  Theil et al. ................ 257/458

FOREIGN PATENT DOCUMENTS

KR    10-2005-0117674    12/2005

* cited by examiner

*Primary Examiner*—Tu-Tu V Ho
(74) *Attorney, Agent, or Firm*—Saliwanchik, Lloyd & Saliwanchik

(57) ABSTRACT

An image sensor and a method of manufacturing the same are provided. The image sensor includes a semiconductor substrate, a metal line layer, a first conduction type conducting layer, a first pixel isolation layer, an intrinsic layer, and second conduction type conducting layer. The semiconductor substrate includes a circuit region. The metal line layer including a plurality of metal lines and an interlayer insulating layer is formed on the semiconductor substrate. The first conductive layer having patterns separated from each other by the pixel isolation layer is formed on the metal lines. The first pixel isolation layer is formed between the separated patterns of the first conduction type conducting layer. The intrinsic layer is formed on the first conductive layer and the first pixel isolation layer. The second conduction type conducting layer is formed on the intrinsic layer.

10 Claims, 4 Drawing Sheets

IMAGE SENSOR AND METHOD OF MANUFACTURING THE SAME

CROSS-REFERENCE TO RELATED APPLICATION

The present application claims the benefit under 35 U.S.C. §119 of Korean Patent Application No. 10-2007-0039099, filed Apr. 23, 2007, which is hereby incorporated by reference in its entirety.

BACKGROUND

In general, an image sensor is a semiconductor device for converting optical images to electrical signals, and is mainly classified as a charge coupled device (CCD) or a Complementary Metal Oxide Semiconductor (CMOS) image sensor.

A unit pixel of a CMOS image sensor includes a photodiode and a MOS transistor, and a CMOS image sensor sequentially detects electric signals of pixels using a switching scheme and thus generates an image.

Compared to the CCD image sensor typically used in the art, a CMOS image sensor has a simple driving type, uses various scanning methods, minimizes the size of a product by processing signals in a single chip, reduces manufacturing costs using compatible CMOS technologies, and reduces power consumption.

The CMOS image sensor includes a photodiode region and a transistor region. The photodiode region converts a light signal to an electric signal, and the transistor region processes the electric signal.

The photodiode and the transistor are typically horizontally-arranged on a semiconductor substrate.

While the horizontal-type CMOS image sensor has advantages over the CCD image sensor, problems still exist.

In the horizontal-type CMOS image sensor, the photodiode is horizontally adjacent to the transistor on the substrate. Therefore, the photodiode region only encompasses a portion of the image sensor. As a result, the fill factor is reduced, and the resolution of the horizontal-type CMOS image sensor is limited.

In addition, with a horizontal-type CMOS image sensor, it is very difficult to optimize the process of simultaneously manufacturing the photodiode and the transistor. A shallow junction is required in order to reduce sheet resistance of rapid transistor processes, but the shallow junction may not be appropriate for the photodiode.

In addition, since additional on-chip functions are often added to the horizontal-type CMOS image sensor, the size of a unit pixel should be increased or decreased in order to maintain sensitivity of the horizontal-type CMOS image sensor.

When the size of the unit pixel is increased, the resolution of the horizontal-type CMOS image sensor is decreased. In addition, when the area of the photodiode is decreased, the sensitivity of the horizontal-type CMOS image sensor is decreased.

BRIEF SUMMARY

Embodiments of the present invention provide an image sensor including a transistor circuit and a photodiode and a method of manufacturing the image sensor, such that the transistor circuit and the photodiode are vertically stacked.

In one embodiment, an image sensor includes: a semiconductor substrate including a circuit region; a metal line layer including a plurality of metal lines and an interlayer insulating layer formed on the semiconductor substrate; a first conductive layer having patterns separated from each other on the metal lines; a first pixel isolation layer comprising intrinsic characteristics between the patterns of the first conductive layer; an intrinsic layer on the first conductive layer and the first pixel isolation layer and a second conductive layer formed on the intrinsic layer.

In another embodiment, a method of manufacturing an image sensor includes: forming a metal line layer including a plurality of metal lines and an interlayer insulating layer formed on a semiconductor substrate including a circuit region; forming a first conductive layer having patterns on the metal lines separated by pixel isolation regions; forming an intrinsic layer on the metal line layer including the first conductive layer and the pixel isolation regions; and forming a second conductive layer on the intrinsic layer.

In a further embodiment, the method includes providing second isolation regions between patterns of the second conductive layer. The second isolation regions can correspond to the pixel isolation regions.

The details of one or more embodiments are set forth in the accompanying drawings and the detailed description below. Other features will be apparent to those skilled in the art from the description and drawings, and from the appended claims.

BRIEF DESCRIPTION OF THE DRAWINGS

FIG. 7 is a cross-sectional view of an image sensor according to an embodiment of the present invention.

DETAILED DESCRIPTION

Reference will now be made in detail to embodiments of the present invention, examples of which are illustrated in the accompanying drawings.

When the terms "on" or "over" are used herein, when referring to layers, regions, patterns, or structures, it is understood that the layer, region, pattern or structure can be directly on another layer or structure, or intervening layers, regions, patterns, or structures may also be present. When the terms "under" or "below" are used herein, when referring to layers, regions, patterns, or structures, it is understood that the layer, region, pattern or structure can be directly under the other layer or structure, or intervening layers, regions, patterns, or structures may also be present.

Figure 7:
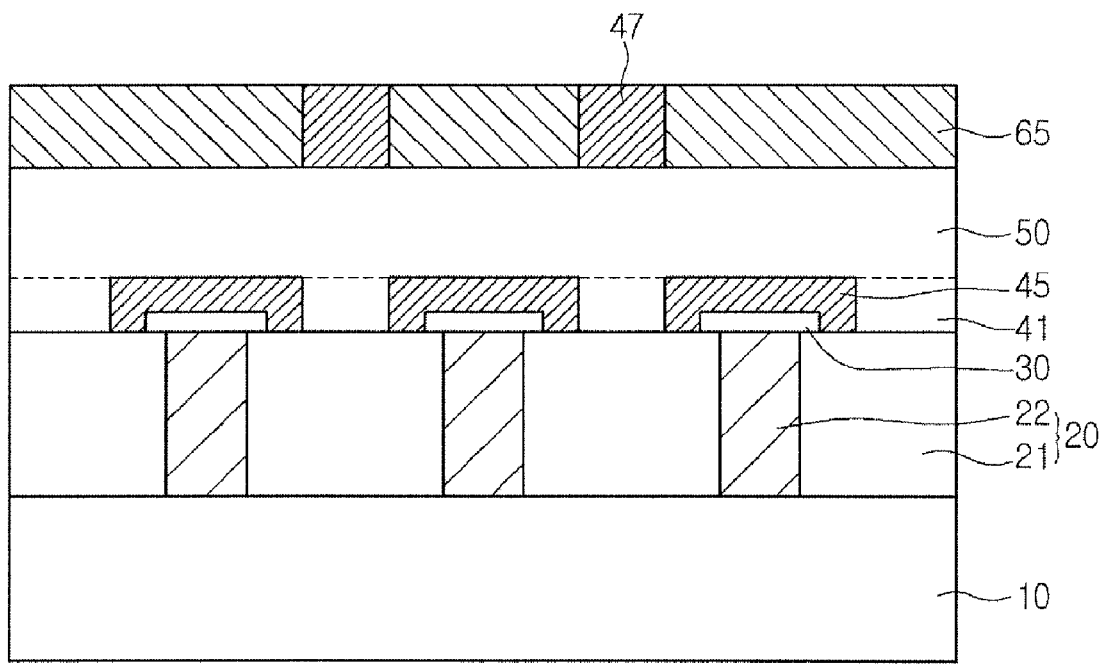

Referring to FIG. 7, an embodiment of an image sensor according to the present invention includes a semiconductor substrate 10 including a circuit region (not shown) and a metal line layer 20 including a plurality of metal lines 22 and an interlayer insulating layer 21 formed on the semiconductor substrate 10. The image sensor can also have a first conductive layer 45 having patterns separated on the metal lines 22, a first pixel isolation layer 41 provided between the patterns of the first conductive layer 45, an intrinsic layer 50 on the first conductive layer 45 and the first pixel isolation layer 41, and a second conductive layer 65 formed on the intrinsic layer 50.

The first pixel isolation layer 41 can be formed of the same material as that of the intrinsic layer 50, effectively extending the region of the intrinsic layer 50.

A second pixel isolation layer 47 can be formed in the second conductive layer 65, thus separating the second conductive layer 65 into the unit pixel.

In an embodiment, the second pixel isolation layer 47 can be formed of the same material as that of the first conductive layer 45. In one embodiment, the second pixel isolation layer 47 can include dopants of the first conductive layer 45 such that the conductivity of the second conductive layer is inhibited, thereby forming the second pixel isolation layer 47.

Hereinafter, a method of manufacturing the image sensor according to embodiments of the present invention will now be described with reference to FIGS. 1 through 7.

Figure 1:
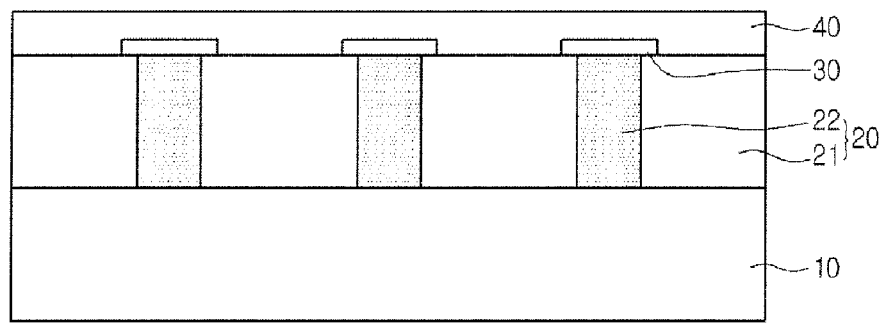
FIGS. 1 through 7 are views illustrating processes of manufacturing an image sensor according to an embodiment of the present invention.

Referring to FIG. 1, a metal line layer 20, including metal lines 22 and an interlayer insulating layer 21, can be formed on a semiconductor substrate 10.

A device isolation layer (not shown) defining an active region and a field region can be formed in the semiconductor substrate 10. In order to form the unit pixel, the circuit region is connected to a photodiode (to be formed in a later process) and formed of transistor structures. The circuit region may convert received light into an electric signal by photoelectric conversion.

Although shown as one layer for simplicity, the metal line layer 20 can be formed of a plurality of layers in order to connect the circuit region to a power line or a signal line.

The metal line layer 20 includes the interlayer insulating layer 21 and the metal lines 22 going through the interlayer insulating layer 21.

In an embodiment, the interlayer insulating layer 21 can be formed of an oxide layer. The metal lines 22 can be formed of various conductive materials including a metal, an alloy, or a silicide. In certain embodiments, the metal lines can be formed of aluminum, copper, cobalt, or tungsten.

In an embodiment, a lower electrode 30 electrically connected to the metal lines 22 can be formed on the metal line layer 20. For example, the lower electrode 30 may be formed of a metal such as Cr, Ti, TiW, or Ta.

After the metal lines 22 connected to the circuit region in the semiconductor substrate 10 are formed in the interlayer insulating layer 21, the photodiode is formed on the metal line layer 20.

The photodiode formed on the metal line layer 20 receives light and electrically converts and stores the light. A P-I-N diode may be used as the photodiode.

A P-I-N diode is a diode with an intrinsic amorphous silicon layer between an n-type amorphous silicon layer and a p-type amorphous silicon layer. The performance of a photodiode depends on efficiency of converting incident light into an electric type and charge capacitance. Electric charges of typical photodiodes of the related art are generated and stored in a depletion region in the substrate generated by a hetero-junction such as P-N, N-P, N-P-N, or P-N-P. The entire intrinsic amorphous silicon layer of the P-I-N diode formed between the n-type amorphous silicon layer and the p-type amorphous silicon layer is a depletion region. Therefore, electric charges are advantageously generated and stored.

The PIN diode can be used as the photodiode. The PIN diode may have a structure such as P-I-N or N-I-P. For example, in an embodiment in which the P-I-N diode has the P-I-N structure, the n-type amorphous silicon is the first conductive layer 45, the intrinsic amorphous silicon is the intrinsic layer 50, and the p-type amorphous silicon is the second conductive layer 65.

A method of forming the photodiode using a P-I-N diode structure will now be described.

Referring again to FIG. 1, an intrinsic layer material 40 can be deposited on the metal line layer 20.

The intrinsic layer material 40 can be formed of intrinsic amorphous silicon. In an embodiment, the intrinsic layer material 40 can be formed using chemical vapor deposition (CVD), such as plasma-enhanced chemical vapor deposition (PECVD). For example, the PECVD can use a gas such as $SiH_4$.

Figure 2:
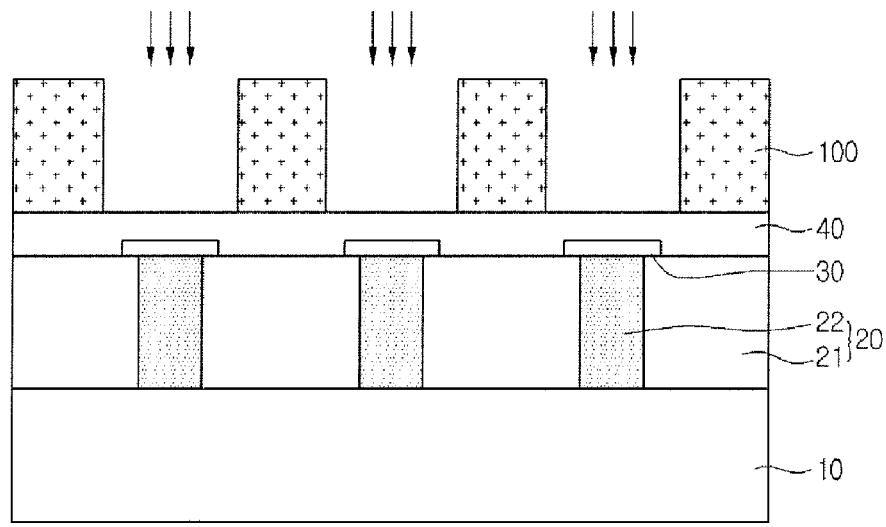

Referring to FIG. 2, a first mask 100 can be formed on the intrinsic layer material 40.

In an embodiment, the first mask 100 can be formed such that at least a portion of the upper surface of the intrinsic layer material 40 corresponding to each of the metal line 22 is exposed. The first mask 100 can be formed by coating, exposing, and developing a photoresist film.

In many embodiments, the metal lines 22 and the photodiode are separated into a unit pixel using the first mask 100. Therefore, the first mask 100 can be formed on at least the portion of the upper surface of the intrinsic layer material 40 which covers the interlayer insulating layer 21.

Then, ions can be implanted into the exposed region of the intrinsic layer material 40 using the first mask 100 formed on the intrinsic layer material 40 as an ion implantation mask.

The ions implanted into the exposed region of the intrinsic layer material 40 can be impurities of a first conductive type. For example, the ions implanted into the exposed region of the intrinsic layer material 40 can be n-type impurities, meaning the first conductive layer 45 would be formed in the intrinsic layer material 40. In an alternate embodiment for a N-I-P diode, the impurities can be p-type impurities. A laser annealing process can be performed to activate the implanted impurities.

Figure 3:
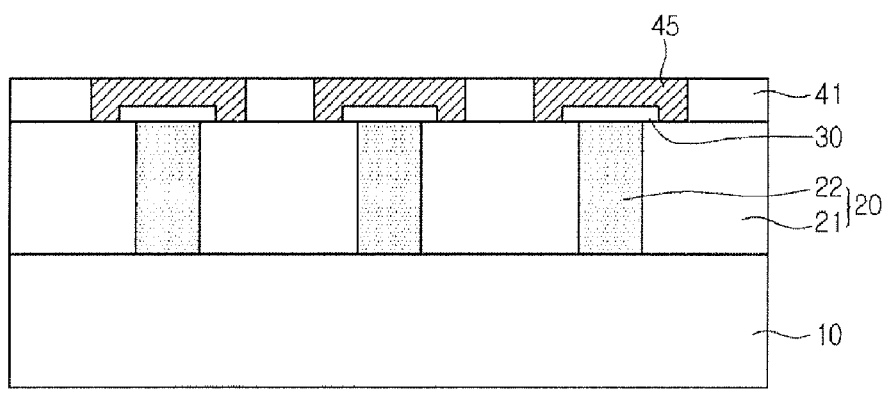

Referring to FIG. 3, after the first mask 100 is removed, the first conductive layer 45 is formed on the metal lines 22 and thus electrically connected to the metal lines 22. Accordingly, the intrinsic layer material 40 is patterned in the first conductive layer 45 to be the first pixel isolation layer 41.

The first conductive layer 45 may function as an N-layer of a P-I-N diode.

Therefore, in many embodiments, the first conductive layer 45 formed on the metal lines 22 is electrically connected to the circuit portion. The first conductive layer 45 is separated into the unit pixel using the first pixel isolation layer 41.

When the first conductive layer 45 is formed by implanting ions into the intrinsic layer material 40, the first conductive layer 45 is formed just on the metal lines 22.

In addition, dark current caused by an etching process is reduced when the first conductive layer 45 is formed by implanting ions into the intrinsic layer material 40.

Furthermore, since the first conductive layer 45 is separated into unit pixels by the first pixel isolation layer 41, cross talk is inhibited, leading to improved quality of the image sensor.

Figure 4:
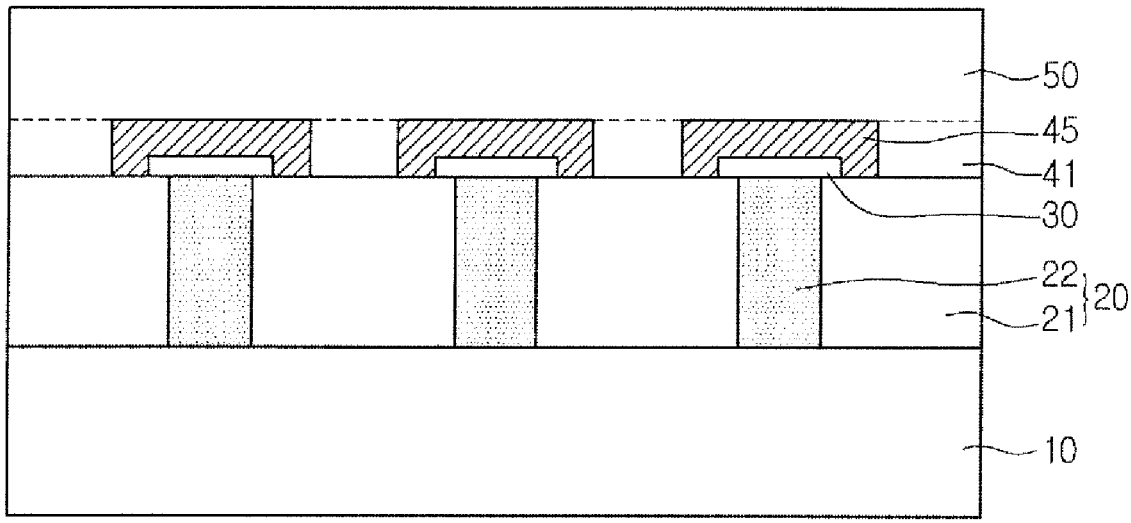

Referring to FIG. 4, an intrinsic layer 50 can be formed on the semiconductor substrate 10 including the first conduction type conducting layer 45 and the first pixel isolation layer 41.

The intrinsic layer 50 may function as an I-layer of the P-I-N diode.

The intrinsic layer 50 can be formed of intrinsic amorphous silicon. In an embodiment, the intrinsic layer 50 can be formed using CVD, such as PECVD. In an embodiment, the PECVD can use a gas such as $SiH_4$.

In many embodiments, the intrinsic layer 50 is about 10 to about 1000 times thicker than the first conductive layer 45. As the thickness of the intrinsic layer 50 is increased, the depletion region of the photodiode is increased, leading to improved generation and storage of electrons.

When the intrinsic layer 50 and the first pixel isolation layer 41 are formed of the same material, the intrinsic layer 50 separates the first conductive layer 45, and the whole region of the intrinsic layer 50 is extended. This results in improved detective quantum efficiency of the photodiode.

Figure 5:
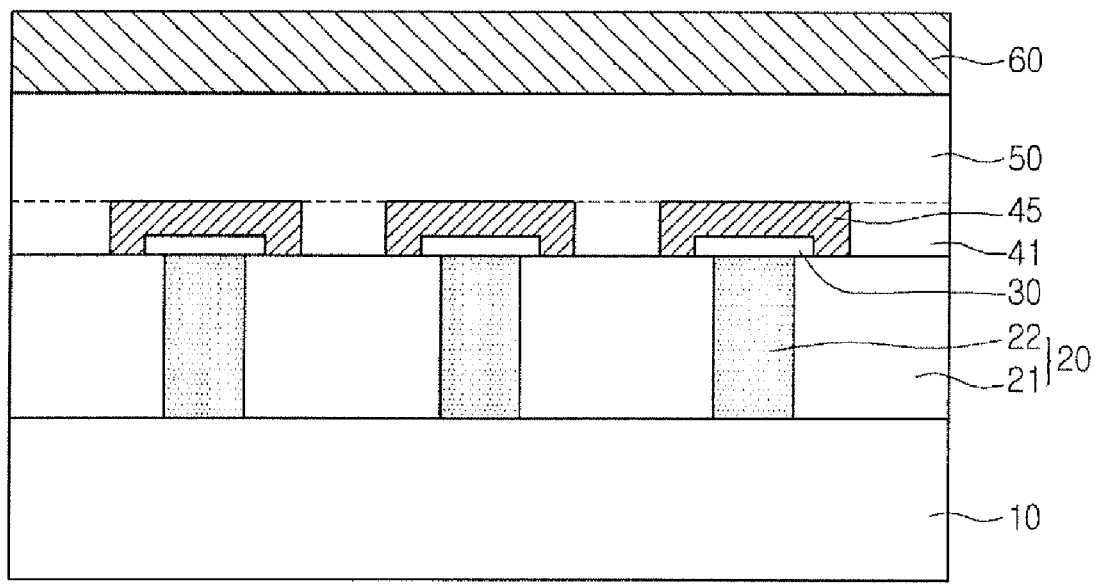

Referring to FIG. 5, a second conductive layer 60 is formed on the intrinsic layer 50.

In an embodiment, the second conductive layer 60 may function as a P-layer of the P-I-N diode since the second conductive layer 60 may be a p-type conductive layer. In an alternative embodiment for a N-I-P node, the second conductive layer 60 is an n-type conductive layer.

In an embodiment, the second conductive layer 60 can be formed of a p-doped amorphous silicon.

The second conductive layer 60 can be formed using CVD, such as PECVD. For example, the PECVD can use a $SiH_4$ gas which is mixed with $BH_3$ or $B_2H_6$.

Figure 6:
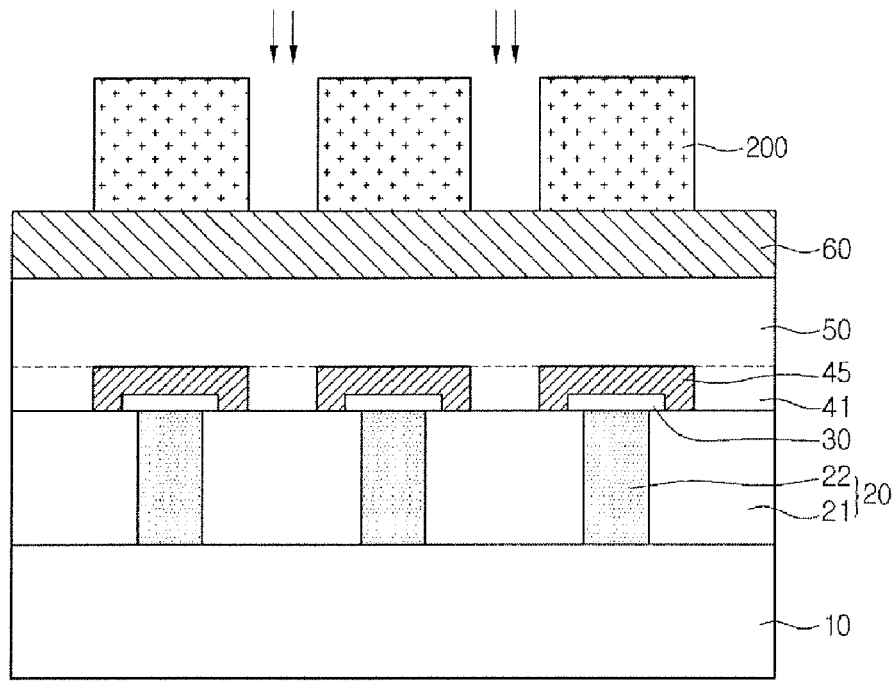

Referring to FIG. 6, a second mask 200 can be formed on the second conductive layer 60.

In an embodiment, the second mask 200 can be formed on at least the portion of the second conductive layer 60 that is over the first conductive layer 45 patterns. The second mask 200 can be formed by coating, exposing, and developing a photoresist film. In an embodiment, the second mask 200 is formed on a portion of the second conductive layer 60 such that the portion of the second conductive layer 60 that is over the first pixel isolation layer 41 is exposed.

In many embodiments, the metal lines 22 and the photodiode are further separated into unit pixels using the second mask 200. Therefore, the second mask 200 can be formed on at least the portion of the upper surface of the second conductive layer 60 that is over the first conductive layer 45.

Ions can be implanted into the exposed region of the second conductive layer 60 using the second mask 200 formed on the second conductive layer 60 as an ion implantation mask.

In an embodiment, the ions implanted into the exposed region of the second conductive layer 60 can be the first conductive type impurities. For example, the ions implanted into the exposed region of the second conductive layer 60 may be n-type impurities. In an embodiment, any material that functions to inhibit conductivity may be used, such as oxygen or nitrogen.

Referring to FIG. 7, a second conductive layer pattern 65 and the second pixel isolation layer 47 are provided on the intrinsic layer 50 after the second mask 200 is removed.

Therefore, the second conductive layer pattern 65 is separated into unit pixels by the second pixel isolation layer 47.

This results in a decrease in crosstalk and noise.

Figure 8:
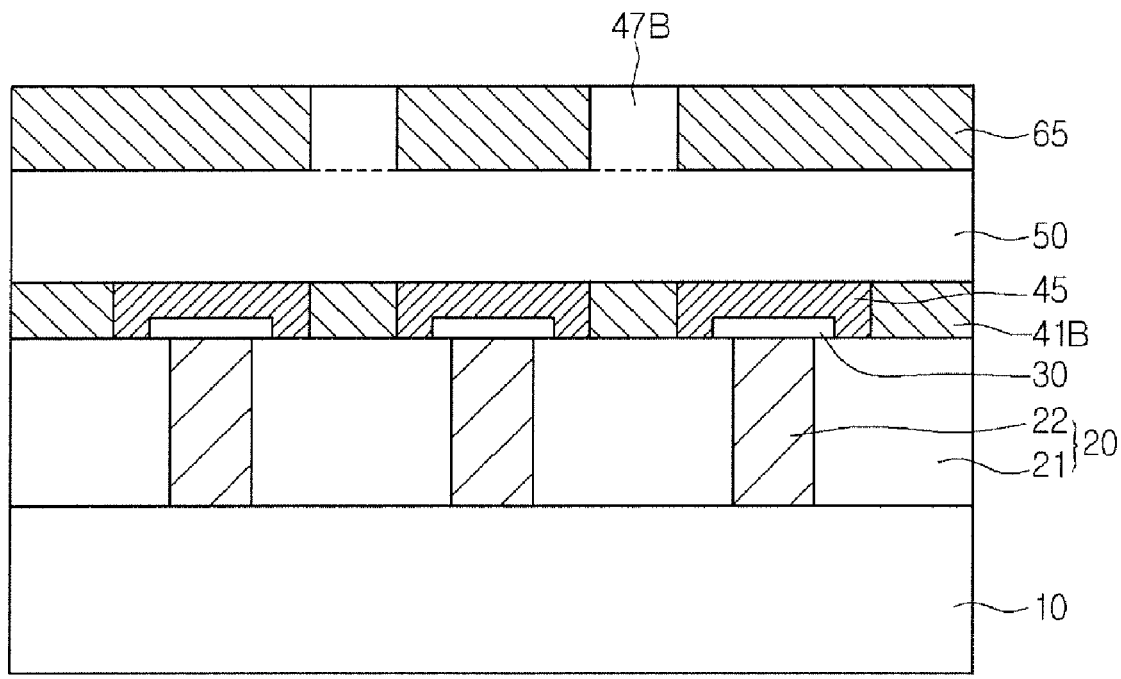
FIG. 8 is a cross-sectional view of an image sensor according to an embodiment of the present invention.

Another method of forming the photodiode using a P-I-N diode structure will now be described with respect to the modifications of the processes described with respect to FIGS. 1-7. FIG. 8 shows one embodiment incorporating modifications of the process described with respect to FIGS. 1-7.

Referring to FIG. 8, one embodiment of an image sensor according to the present invention includes a semiconductor substrate 10 including a circuit region (not shown) and a metal line layer 20 including a plurality of metal lines 22 and an interlayer insulating layer 21 formed on the semiconductor substrate 10. The image sensor can also have a first conductive layer 45 having patterns separated on the metal lines 22, a first pixel isolation layer 41B provided between the patterns of the first conductive layer 45, an intrinsic layer 50 on the first conductive layer 45 and the first pixel isolation layer 41B, a second conductive layer 65 having patterns formed on the intrinsic layer 50, and a second pixel isolation layer 47B provided between the patterns of the second conductive layer 65.

The second pixel isolation layer 47B can be formed of the same material as that of the intrinsic layer 50, effectively extending the region of the intrinsic layer 50.

In an embodiment, the first pixel isolation layer 41B can be formed of the same material as that of the second conductive layer 65. In one embodiment, the first pixel isolation layer 41B can include dopants of the second conductive layer 65 such that the conductivity of the first conductive layer is inhibited, thereby forming the first pixel isolation layer 41B.

In particular, the first conductive layer 45 electrically connected to the metal lines 22 and separated into the unit pixel using the first pixel isolation layer 41B can be formed by depositing a first conductive layer on the entire surface of the substrate 10 including the first metal line layer 20 in a similar process as described with respect to the second conductive layer 60 illustrated in FIG. 6.

For example, the first conductive layer can be formed of an n-doped amorphous silicon. In an embodiment, the first conductive layer can be formed using a CVD such as PECVD. In one embodiment the PECVD can use a $SiH_4$ gas mixed with $PH_3$ or $P_2H_5$.

Then, a first mask can be formed on the first conductive layer such that a portion of the first conductive layer on metal lines 22 is covered while exposing regions above the interlayer insulating layer 21 for separating first conductive layer into unit pixels.

Ions can be implanted into the exposed region of the first conductive layer using the first mask as an ion implantation mask. The ions can be second conductive type impurities or any material that functions to inhibit conductivity, such as oxygen or nitrogen. Thereby, the first pixel isolation layer 41B may be formed as shown in FIG. 8.

As another embodiment, the second conductive layer pattern 65 separated into the unit pixel by the second pixel isolation layer 47 can be formed by depositing an intrinsic layer in a similar process as described with respect to the first conductive layer pattern 45 illustrated in FIGS. 1-3. Referring again to FIG. 8, the second conductive layer pattern 47B can be the remaining intrinsic layer after implanting p-type dopants into the second conductive layer pattern region 65. In an embodiment, the intrinsic layer deposited for the second conductive layer patterns 65 can be formed during the process of forming the intrinsic layer 50. In such an embodiment, the intrinsic layer 50 is formed to have a thickness including the necessary thickness for the second conductive layer.

Though not shown, an upper electrode, a color filter, and a microlens may be formed over a semiconductor substrate including the second conductive layer 60 and the second pixel isolation layer 47.

The upper electrode may be a transparent electrode which has high light permeability and high conductivity. For example, the upper electrode may be formed of indium tin oxide (ITO) or cadmium tin oxide (CTO).

The transistor circuit and the photodiode of the image sensor according to embodiments of the present invention are vertically stacked.

Vertically stacking the transistor circuit and the photodiode leads to a fill factor of almost 100%.

Furthermore, the sensitivity of the vertically-stacked image sensor is higher than that of a horizontal image sensor in the same pixel size.

In addition, each unit pixel can have a more complicated circuit without reducing the sensitivity of the image sensor.

Moreover, by vertically stacking the transistor circuit and the photodiode, each unit pixel is insulated, which inhibits crosstalk and the reliability of the image sensor.

Also, increasing the surface area of the photodiode can increase the photo-detection efficiency of the photodiode when a unit pixel including the photodiode is formed.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor, comprising:
   a semiconductor substrate comprising a circuit region;
   a metal line layer formed on the semiconductor substrate and comprising a plurality of metal lines and an interlayer insulating layer;
   a first conductive layer, comprising patterns separated from each other, formed on the plurality of metal lines;
   a first pixel isolation layer provided between the patterns of the first conductive layer;
   an intrinsic layer formed on the metal line layer;
   a second conductive layer formed on the intrinsic layer; and
   a second pixel isolation layer provided in the second conductive layer at positions corresponding to the first pixel isolation layer;
   wherein the first pixel isolation layer comprises a dopant capable of inhibiting the conductivity of the first conductive layer.

2. The image sensor according to claim 1, wherein the first conductive layer comprises amorphous silicon implanted with n-type impurities.

3. The image sensor according to claim 1, wherein the first conductive layer comprises a doped amorphous silicon.

4. The image sensor according to claim 1, wherein the first pixel isolation layer and the intrinsic layer are formed of the same material.

5. The image sensor according to claim 1, wherein the second conductive layer comprises a doped amorphous silicon.

6. The image sensor according to claim 1, further comprising a lower electrode between each of the plurality of metal lines and the patterns of the first conductive layer.

7. The image sensor according to claim 1, wherein the second pixel isolation layer and the first conductive layer are formed of the same material.

8. An image sensor, comprising:
   a semiconductor substrate comprising a circuit region;
   a metal line layer formed on the semiconductor substrate and comprising a plurality of metal lines and an interlayer insulating layer;
   a first conductive layer, comprising patterns separated from each other, formed on the plurality of metal lines;
   a first pixel isolation layer provided between the patterns of the first conductive layer;
   an intrinsic layer formed on the metal line layer;
   a second conductive layer formed on the intrinsic layer; and
   a second pixel isolation layer provided in the second conductive layer at positions corresponding to the first pixel isolation layer;
   wherein the second pixel isolation layer and the intrinsic layer are formed of the same material.

9. The image sensor according to claim 8, wherein the second conductive layer comprises amorphous silicon implanted with p-type impurities.

10. An image sensor, comprising:
    a semiconductor substrate comprising a circuit region;
    a metal line layer formed on the semiconductor substrate and comprising a plurality of metal lines and an interlayer insulating layer;
    a first conductive layer, comprising patterns separated from each other, formed on the plurality of metal lines;
    a first pixel isolation layer provided between the patterns of the first conductive layer;
    an intrinsic layer formed on the metal line layer;
    a second conductive layer formed on the intrinsic layer; and
    a second pixel isolation layer provided in the second conductive layer at positions corresponding to the first pixel isolation layer;
    wherein the second pixel isolation layer comprises a dopant capable of inhibiting the conductivity of the second conductive layer.

* * * * *